US009443939B2

United States Patent
Dargis et al.

(10) Patent No.: US 9,443,939 B2
(45) Date of Patent: Sep. 13, 2016

(54) STRAIN COMPENSATED REO BUFFER FOR III-N ON SILICON

(71) Applicants: Rytis Dargis, Fremont, CA (US); Erdem Arkun, San Carlos, CA (US); Radek Roucka, Mountain View, CA (US); Andrew Clark, Los Altos, CA (US); Michael Lebby, Apache Junction, AZ (US)

(72) Inventors: Rytis Dargis, Fremont, CA (US); Erdem Arkun, San Carlos, CA (US); Radek Roucka, Mountain View, CA (US); Andrew Clark, Los Altos, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 14/924,047

(22) Filed: Oct. 27, 2015

(65) Prior Publication Data
US 2016/0133708 A1 May 12, 2016

Related U.S. Application Data

(62) Division of application No. 13/278,952, filed on Oct. 21, 2011.

(51) Int. Cl.
*H01L 29/20* (2006.01)
*H01L 29/06* (2006.01)
*H01L 29/16* (2006.01)
*H01L 21/02* (2006.01)

(52) U.S. Cl.
CPC ....... *H01L 29/2003* (2013.01); *H01L 21/0254* (2013.01); *H01L 21/02381* (2013.01); *H01L 21/02439* (2013.01); *H01L 21/02488* (2013.01); *H01L 21/02532* (2013.01); *H01L 29/0657* (2013.01); *H01L 29/16* (2013.01)

(58) Field of Classification Search
None
See application file for complete search history.

(56) References Cited

U.S. PATENT DOCUMENTS

| | | | |
|---|---|---|---|
| 2003/0168002 A1* | 9/2003 | Zaidi | C30B 25/18 117/101 |
| 2006/0145186 A1* | 7/2006 | Wallis | C30B 23/02 257/190 |
| 2010/0109047 A1* | 5/2010 | Clark | H01L 21/02381 257/190 |
| 2010/0155699 A1* | 6/2010 | Sakong | H01L 33/02 257/14 |

\* cited by examiner

*Primary Examiner* — Khaja Ahmad
(74) *Attorney, Agent, or Firm* — Robert A. Parsons; Michael W. Goltry; Parsons & Goltry

(57) ABSTRACT

A method of fabricating a rare earth oxide buffered III-N on silicon wafer including providing a crystalline silicon substrate, depositing a rare earth oxide structure on the silicon substrate including one or more layers of single crystal rare earth oxide, and depositing a layer of single crystal III-N material on the rare earth oxide structure so as to form an interface between the rare earth oxide structure and the layer of single crystal III-N material. The layer of single crystal III-N material produces a tensile stress at the interface and the rare earth oxide structure has a compressive stress at the interface dependent upon a thickness of the rare earth oxide structure. The rare earth oxide structure is grown with a thickness sufficient to provide a compressive stress offsetting at least a portion of the tensile stress at the interface to substantially reduce bowing in the wafer.

14 Claims, 3 Drawing Sheets

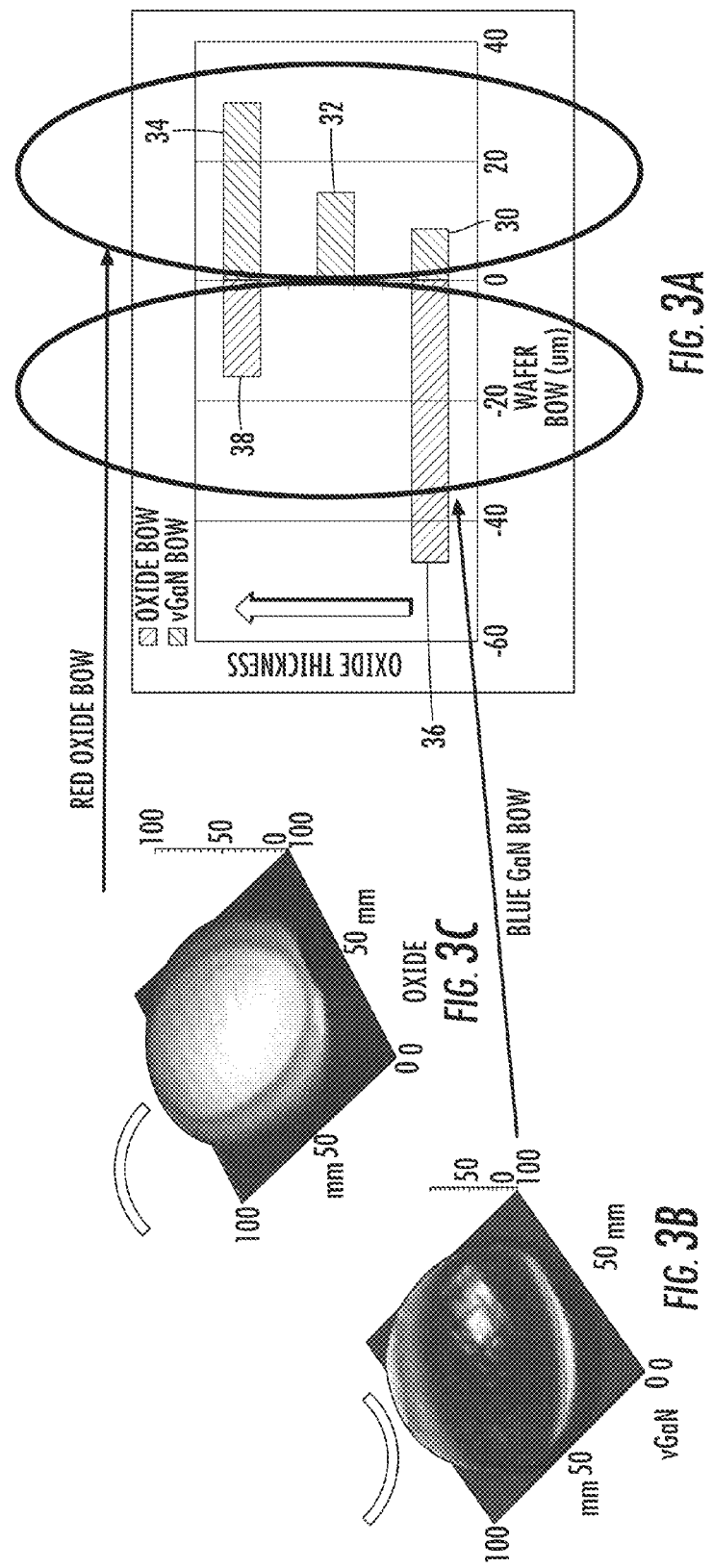

STRAIN COMPENSATED REO BUFFER FOR III-N ON SILICON

CROSS-REFERENCE TO RELATED APPLICATIONS

This application is a divisional application of currently pending U.S. application Ser. No. 13/278,952, filed 21 Oct. 2011.

FIELD OF THE INVENTION

This invention relates in general to the deposition of III-N on silicon wafers.

BACKGROUND OF THE INVENTION

It has been found that III-N materials are a desirable semiconductor material in many electronic and photonic applications. As understood in the art, the III-N semiconductor material must be provided as a crystalline or single crystal formation for the most efficient and useful bases for the fabrication of various electronic and photonic devices therein. Further, the single crystal III-N semiconductor material is most conveniently formed on single crystal silicon wafers because of the extensive background and technology developed in the silicon semiconductor industry. However, efforts to grow III-N on silicon wafers have resulted in substantially bowed wafers due to tensile strain in the III-N material.

It would be highly advantageous, therefore, to remedy the foregoing and other deficiencies inherent in the prior art.

Accordingly, it is an object of the present invention to provide new and improved methods of growing III-N on silicon substrates that are strain compensated.

It is another object of the present invention to provide new and improved substantially flat or unbowed, large diameter, high yield epitaxial wafers of III-N on silicon.

It is another object of the present invention to provide new and improved methods of providing substantially flat, large diameter, high yield epitaxial wafers of III-N on silicon.

SUMMARY OF THE INVENTION

Briefly, the desired objects and aspects of the instant invention are achieved in accordance with a preferred method of fabricating a rare earth oxide buffered III-N on silicon wafer including providing a crystalline silicon substrate, depositing a rare earth oxide structure on the silicon substrate including one or more layers of single crystal rare earth oxide, and depositing a layer of single crystal III-N material on the rare earth oxide structure so as to form an interface between the rare earth oxide structure and the layer of single crystal III-N material. The layer of single crystal III-N material produces a tensile stress at the interface and the rare earth oxide structure has a compressive stress at the interface dependent upon a thickness of the rare earth oxide structure. The rare earth oxide structure is grown with a thickness sufficient to provide a compressive stress offsetting at least a portion of the tensile stress at the interface to substantially reduce bowing in the wafer.

The desired objects and aspects of the instant invention are further realized in accordance with a preferred embodiment of a rare earth oxide buffered III-N on silicon wafer including a crystalline silicon substrate with a rare earth oxide structure deposited on the silicon substrate and including one or more layers of single crystal rare earth oxide and a layer of single crystal III-N material deposited on the rare earth oxide structure so as to form an interface between the rare earth oxide structure and the layer of single crystal III-N material. The layer of single crystal III-N material produces a tensile stress at the interface and the rare earth oxide structure has a compressive stress at the interface dependent upon a thickness of the rare earth oxide structure. The thickness of the rare earth oxide structure is grown to provide a compressive stress offsetting at least a portion of the tensile stress at the interface to substantially reduce bowing in the wafer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 3A is a graphical representation of the relative strains in GaN and REO with varying thicknesses grown on a 100 mm wafer;

FIG. 3B is a pictorial representation of a negative bowing of the wafer; and

FIG. 3C is a pictorial representation of a positive bowing of the wafer.

DETAILED DESCRIPTION OF THE DRAWINGS

It has been found that any attempted growth of a III-N layer directly on silicon, or even in some cases on a rare earth oxide intermediate layer, results in substantial tensile stress in the III-N layer which results in excessive bowing of the wafer. This bowing of the wafer can make the wafer impractical for further processing, resulting in substantial amounts of wasted material and effort.

Figure 1:
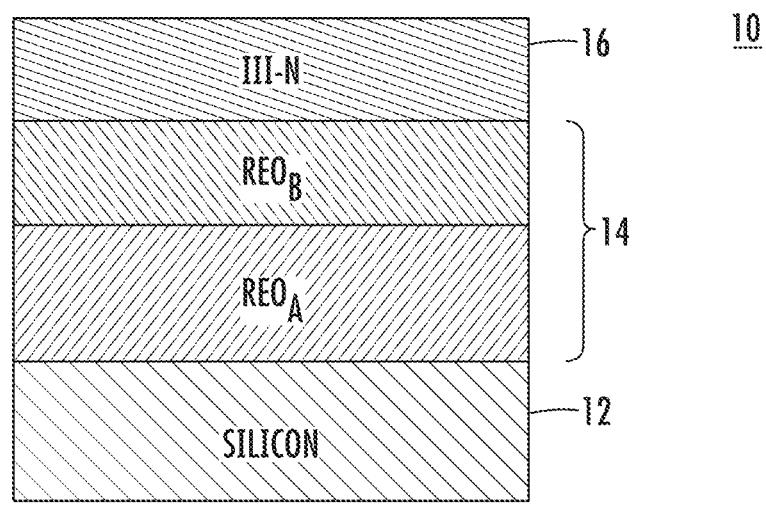
FIG. 1 is a simplified layer diagram of a strain compensated rare earth oxide (REO) buffered III-N on silicon wafer, in accordance with the present invention.

Referring to FIG. 1, a simplified layer diagram is illustrated of a high yield epitaxial wafer 10 including III-N on silicon in accordance with the present invention. Wafer 10 includes a single crystal silicon substrate 12 which, it will be understood, is or may be a standard well know single crystal silicon wafer or portion thereof generally known and used in the semiconductor industry. Single crystal silicon substrate 12, it will be understood, is not limited to any specific crystal orientation but could include <111> silicon, <110> silicon, <100> silicon or any other orientation or variation known and used in the art.

A rare earth oxide (REO) structure 14 is grown directly on the surface of substrate 12 using any of the well known growth methods, such as MBE, MOCVD, PLD (pulsed laser deposition), sputtering, ALD (atomic layer deposition), or any other known growth method for thin films. Further, the growth method used will generally be used for all additional layers and may conveniently be employed to grow the entire structure in a continuous process sometimes referred to herein as performed within a one wafer single epitaxial process. REO structure 14 may be considered one or more single crystal or crystalline layers or a single layer of single crystal or crystalline material with a plurality of sub-layers, either of which will be referred to herein for convenience of understanding as an "REO structure".

Further, REO structure 14 may vary from the bottom to the top (as described in more detail below) and/or within each layer either linearly or in a step by step process. In any case, REO structure 14 is positioned between the surface of substrate 12 and the lower surface of a single crystal layer of III-N material 16. Throughout this disclosure whenever rare earth materials are mentioned it will be understood that "rare earth" materials are generally defined as any of the lanthanides as well as scandium and yttrium. Also, whenever III-N materials are mentioned it will be understood that "III-N" materials are generally defined as nitrides of any of the III materials from the periodic table of elements.

Figure 2A:
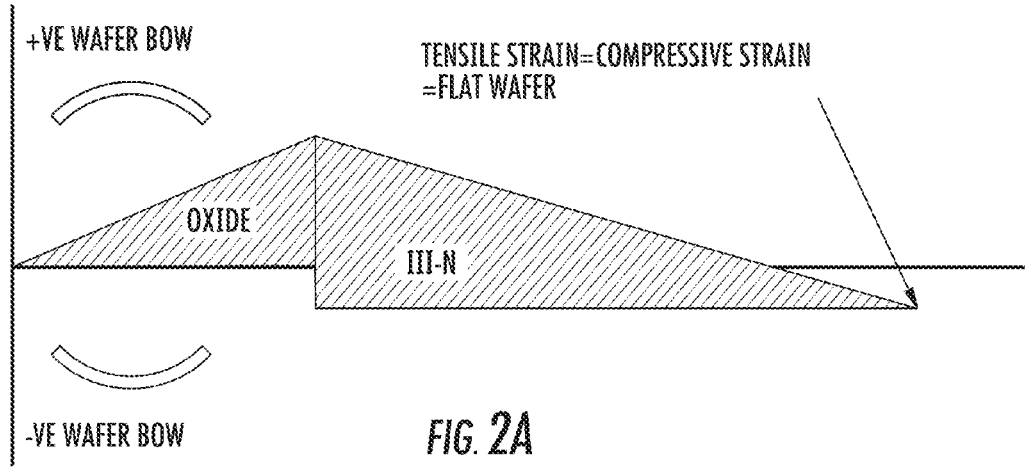
FIG. 2A illustrates in a semi-graphic representation the relative strains between REO and III-N materials forming a negative bow at the surface.
Figure 2B:
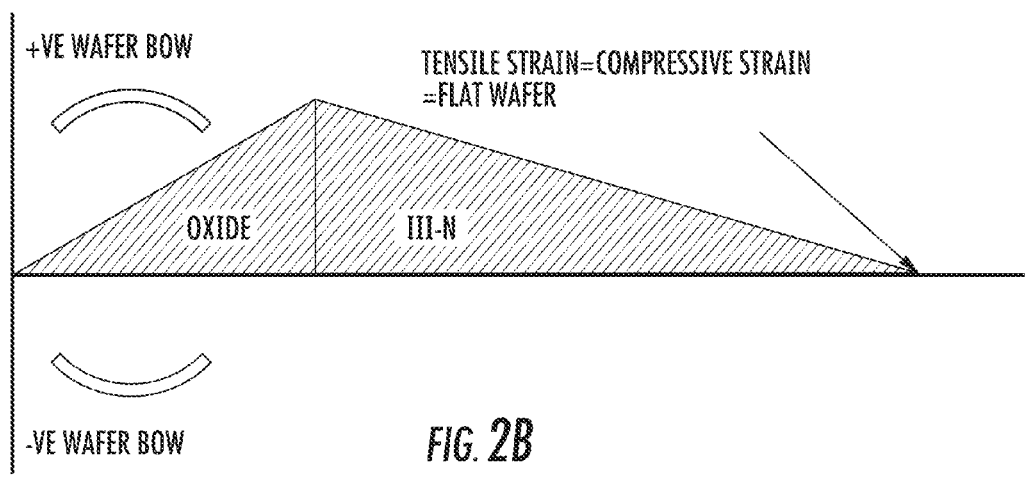
FIG. 2B illustrates in a semi-graphic representation the relative strains between REO and III-N materials forming an unbowed surface.

Generally, the rare earth oxide of structure 14 may be either a binary or a ternary alloy and may include two or more layers of different compositions to form an intermediate buffer between substrate 12 and III-N material 16. For example, in different applications different REOs may be included in REO structure 14 to perform different functions. The rare earth oxide of structure 14 will produce a compressive strain at the interface with III-N material 16. Further, by increasing the thickness of structure 14 the amount of compressive strain at the interface is increased. That is, the compressive stress in structure 16 is substantially zero at the interface with substrate 12 and increases generally linearly (or at some predetermined rate) up to the interface with III-N material 16. As illustrated in FIG. 2a, when the compressive stress of the rare earth oxide of structure 14 is less than the tensile stress of the III-N material 16 a wafer with a negative bow at the surface is produced. However, as illustrated in FIG. 2b, when the compressive stress of the rare earth oxide of structure 14 is equal to the tensile stress of the III-N material 16 a wafer with a flat or unbowed surface is produced.

Referring additionally to FIG. 3a, a graphical representation of the relative strains in GaN and REO with varying thicknesses grown on a 100 mm wafer is illustrated. Initial testing performed on 100 mm silicon wafers and using GaN as the III-N material showed that increasing the thickness of REO structure 14 increased the positive bowing, as graphically represented by bars 30, 32, and 34. The thinner REO, represented by bar 30, produced a positive bowing of approximately 10 μm while the thickest REO, represented by bar 34, produced a bowing of approximately 30 μm.

Referring additionally to FIG. 3b, a pictorial represents the resulting negative bowing of the wafer caused by the tensile stress of the III-N material, represented by bar 36, being substantially larger than the compressive stress of the REO structure, represented by bar 30. Conversely, FIG. 3c pictorial represents the resulting positive bowing of the wafer caused by the tensile stress of the III-N material, represented by bar 38, being substantially smaller than the compressive stress of the REO structure, represented by bar 34. Thus, it can be seen that when the compressive stress of the rare earth oxide of structure 14 is equal to the tensile stress of the III-N material 16 a wafer with a flat or unbowed surface is produced.

It should be understood that slightly different amounts of compressive stress may be produced by different REO structures but generally the thickness of the REO structure determines the total compressive stress at the interface with the III-N material. Also, the ultimate thickness of the III-N material can result in different amounts of tensile stress so that, as a general rule, thicker layers of III-N material produce greater tensile stress and require thicker REO structures that produce greater compressive stress.

While III-N materials with tensile stresses are the primary target for this invention, it should also be noted that the concept is useful for the growth of other semiconductor materials, some of which have compressive stresses, which are traditionally difficult to grow on silicon substrates. A typical example of such semiconductor material is germanium (Ge) which in combination with a silicon substrate or wafer produces a compressive stress. It should be understood that rare earth materials with crystalline structures both larger than silicon (or a multiple thereof) and smaller than silicon (or a multiple thereof) are available. Thus, a buffer layer of REO can be grown that will compensate for a semiconductor that creates either a tensile of a compressive stress. Thus, any semiconductor material that results in either a tensile stress or a compressive stress can be compensated by REO structures with a thickness sufficient to produce approximately equal and opposite amounts of either compressive stress or tensile stress.

Thus, new and improved structure and methods of growing III-N and other semiconductor materials on silicon substrates have been disclosed. The new and improved methods provide large diameter, high yield epitaxial wafers of III-N nitrides on silicon with substantially flat surfaces. The tensile and compressive stresses are specifically engineered to prevent or overcome any bowing in the III-n or other semiconductor layer. Also, the high yield epitaxial wafers of III-N or other semiconductor on silicon can be grown within a one wafer single epitaxial process.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A rare earth oxide buffered III-N on a silicon wafer comprising:
   a crystalline silicon substrate;
   a rare earth oxide structure deposited on the crystalline silicon substrate and including one or more layers of single crystal rare earth oxide, a lower surface of the rare earth oxide structure forming a first interface with the crystalline silicon substrate;
   a layer of single crystal III-N material deposited on the rare earth oxide structure so as to form a second interface between the rare earth oxide structure and the layer of single crystal III-N material, and the layer of single crystal III-N material producing a tensile stress at the second interface; and
   the rare earth oxide structure having a compressive stress at the first interface that is substantially zero and a compressive stress at the second interface dependent upon a thickness of the rare earth oxide structure, and the rare earth oxide structure having the thickness providing a compressive stress at the second interface offsetting at least a portion of the tensile stress at the second interface such that the thickness of the rare earth oxide structure and the thickness of the layer of single crystal III-N material are engineered to produce the silicon wafer with a substantially flat surface.

2. The rare earth oxide buffered III-N on the silicon wafer as claimed in claim 1 wherein the thickness of the rare earth oxide structure provides a compressive stress approximately equal to the tensile stress of the layer of single crystal III-N material at the second interface whereby the layer of single crystal III-N material on the crystalline silicon substrate is provided having a substantially flat surface.

3. The rare earth oxide buffered III-N on the silicon wafer as claimed in claim 1 wherein the rare earth oxide structure includes one of a binary alloy and a ternary alloy.

4. The rare earth oxide buffered III-N on the silicon wafer as claimed in claim 1 wherein the rare earth oxide structure include two or more layers of different compositions.

5. A rare earth oxide buffered semiconductor on a silicon wafer comprising:
   a crystalline silicon substrate;
   a rare earth oxide structure deposited on the crystalline silicon substrate and including one or more layers of single crystal rare earth oxide, a lower surface of the rare earth oxide structure forming a first interface with the crystalline silicon substrate;
   a layer of single crystal semiconductor material deposited on the rare earth oxide structure so as to form a second interface between the rare earth oxide structure and the layer of single crystal semiconductor material, and the layer of single crystal semiconductor material producing a tensile stress at the second interface; and
   the rare earth oxide structure having a compressive stress at the interface dependent upon a thickness of the rare earth oxide structure, and the thickness of the rare earth oxide structure providing the compressive stress offsetting at least a portion of the tensile stress at the interface to substantially reduce bowing in the silicon wafer,
   the rare earth oxide structure having a compressive stress at the first interface that is substantially zero and a compressive stress at the second interface dependent upon the thickness of the rare earth oxide structure, and the rare earth oxide structure having the thickness providing a compressive stress at the second interface offsetting at least a portion of the tensile stress at the second interface to produce the silicon wafer with a substantially flat surface.

6. The rare earth oxide buffered semiconductor on the silicon wafer as claimed in claim 5 wherein the thickness of the rare earth oxide structure provides the compressive stress approximately equal to the tensile stress of the layer of single crystal semiconductor material at the interface whereby the layer of single crystal semiconductor material on the crystalline silicon substrate is provided having a substantially flat surface.

7. The rare earth oxide buffered semiconductor on the silicon wafer as claimed in claim 5 wherein the rare earth oxide structure includes one of a binary alloy and a ternary alloy.

8. The rare earth oxide buffered semiconductor on the silicon wafer as claimed in claim 5 wherein the rare earth oxide structure include two or more layers of different compositions.

9. The rare earth oxide buffered semiconductor on the silicon wafer as claimed in claim 5 wherein the layer of single crystal semiconductor material includes germanium.

10. The rare earth oxide buffered semiconductor on the silicon wafer as claimed in claim 5 wherein the layer of single crystal semiconductor material includes GaN.

11. The rare earth oxide buffered III-N on the silicon wafer as claimed in claim 1 wherein the layer of single crystal III-N material includes GaN.

12. The rare earth oxide buffered III-N on the silicon wafer as claimed in claim 1 wherein the rare earth oxide structure includes a positive bow due to the tensile stress in the layer of single crystal III-N material, the amount of bowing being dependent upon the thickness of the rare earth oxide structure.

13. The rare earth oxide buffered semiconductor on the silicon wafer as claimed in claim 5 wherein the rare earth oxide structure includes a positive bow due to a tensile stress in the layer of single crystal semiconductor material, the amount of bowing being dependent upon the thickness of the rare earth oxide structure.

14. The rare earth oxide buffered semiconductor on the silicon wafer as claimed in claim 5 wherein the layer of single crystal semiconductor material includes III-V material.

* * * * *